United States Patent
Na et al.

(10) Patent No.: US 8,333,083 B2
(45) Date of Patent: Dec. 18, 2012

(54) SYSTEM TO SUPPORT TESTING OF ELECTRONIC DEVICES, TEMPERATURE CONTROL UNIT FOR THE SYSTEM, AND METHOD FOR CONTROLLING INTERNAL TEMPERATURE OF CHAMBER OF THE SYSTEM

(75) Inventors: Yun-Sung Na, Cheunan-Si (KR);
Tae-Hung Ku, Suwon-si (KR);
Cheul-Gyu Boo, Hwaseong Si (KR)

(73) Assignee: TechWing Co., Ltd., Hwascong-si (KR)

( * ) Notice: Subject to any disclaimer, the term of this patent is extended or adjusted under 35 U.S.C. 154(b) by 954 days.

(21) Appl. No.: 12/400,243

(22) Filed: Mar. 9, 2009

(65) Prior Publication Data
US 2009/0230201 A1  Sep. 17, 2009

(30) Foreign Application Priority Data

Mar. 14, 2008 (KR) .................. 10-2008-0024106
Jun. 3, 2008 (KR) .................. 10-2008-0052210

(51) Int. Cl.
*F25D 23/12* (2006.01)
*F28D 15/00* (2006.01)
*G01R 31/00* (2006.01)
*H05K 7/20* (2006.01)

(52) U.S. Cl. ............. 62/259.2; 165/104.33; 324/750.03; 361/696

(58) Field of Classification Search .................. 236/49.2, 236/49.3; 62/259.2; 165/104.33, 104.14, 165/11.1; 361/695, 696, 691, 699, 679.02, 361/679.46
See application file for complete search history.

(56) References Cited

U.S. PATENT DOCUMENTS 6,437,593 B1    8/2002  Ito et al.
6,997,006 B2 *  2/2006  Kameyama et al. ......... 62/259.2

FOREIGN PATENT DOCUMENTS

JP    2008-032740 A    2/2008

* cited by examiner

*Primary Examiner* — Chen Wen Jiang
(74) *Attorney, Agent, or Firm* — Jefferson IP Law, LLP

(57) ABSTRACT

A system to support the testing of electronic devices and a temperature control unit for the system are disclosed. A temperature controlling method for a chamber of the system is also disclosed. Low or high temperature air is supplied to the inside of the chamber when the electronic devices are tested at low or high temperature. External air is supplied to the inside of the chamber when the electronic devices are tested at room temperature.

12 Claims, 9 Drawing Sheets

SYSTEM TO SUPPORT TESTING OF ELECTRONIC DEVICES, TEMPERATURE CONTROL UNIT FOR THE SYSTEM, AND METHOD FOR CONTROLLING INTERNAL TEMPERATURE OF CHAMBER OF THE SYSTEM

PRIORITY

This application claims the benefit under 35 U.S.C. §119 (a) of a Korean patent application filed on Mar. 14, 2008 in the Korean Intellectual Property Office and assigned Serial No. 10-2008-0024106 and a Korean patent application filed on Jun. 3, 2008 in the Korean Intellectual Property Office and assigned Serial No. 10-2008-0052210, the entire disclosures of both of which are hereby incorporated by reference.

BACKGROUND OF THE INVENTION

1. Field of the Invention

The present invention relates to a system to support testing of electronic devices. More particularly, the present invention relates to a temperature control unit that can control the internal temperature of the chamber of a system to support the testing of electronic devices.

2. Description of the Related Art

A system to support the testing of electronic devices serves to provide electronic devices to a tester, so that they can be electrically contacted and tested by the tester. The system is also called a handler.

Electronic devices need to be tested in a state where they have been undergoing thermal stress. In this case, the system to support the testing of electronic devices provides a tester with electronic devices in a state where thermal stress is being applied to them, so that the tester tests them.

FIG. 1 is a plan view illustrating a general system to support the testing of electronic devices, which can apply thermal stress to electronic devices.

As shown in FIG. 1, the general system includes a loading device 110, a chamber 120, an unloading device 130, a temperature control unit 140, an inlet shutter 150, and an outlet part shutter 160.

The loading device 110 serves to load electronic devices on a carrier board CB located at a loading site LP.

The chamber 120 has an inlet 121 through which the carrier board CB is carried in and an outlet 122 through which the carrier board CB is carried out. It allows the electronic devices, loaded on the carrier board CB, to be assimilated with a test temperature condition and then to be tested through a tester.

The unloading device 130 sorts electronic devices loaded on the carrier board CB, according to the grade, and unloads them from the carrier board CB, where the carrier board CB is located at an unloading site UP after being carried out from the chamber 120 through the outlet 122.

The temperature control unit 140 controls the internal temperature of the chamber 120 to apply thermal stress to electronic devices located in the chamber 120. It is installed to the outside at the upper side of the chamber 120. It will be described in detail later.

The inlet shutter 150 and the outlet shutter 160 serve to open or close the inlet 121 and the outlet 122, so that the carrier board CB can be carried in to and carried out from the chamber 120 through the inlet 121 and the outlet 122, respectively. The inlet and outlet shutters 150 and 160 also serve to seal the chamber 120 and thus protect the inside of the chamber 120 from outside air. Technology regarding these inlet and outlet shutters 150 and 160 has been published through Korean Patent Publication NO. 10-2007-0063904 entitled "TEST HANDLER AND SHUTTER THEREFOR," so their detailed description will be omitted in this application.

In FIG. 1, the trajectory indicated by symbol "C" shows a circulation path of the carrier board CB.

The temperature control unit 140, as shown in FIG. 2, includes a fan 141, a fan driving device 142, a fan housing 143, a heater 144, and a gas supplier 145.

The fan 141 serves to supply air to the chamber 120. The fan driving device 142 drives the fan 141.

The fan housing 143 includes the fan 141 therein. It has a suction hole 143a for sucking air from the chamber 120 and a discharging hole 143b for discharging it back into the chamber 120.

The heater 144 serves to heat air discharged through the discharging hole 143b. The gas supplier 145 supplies low temperature gas that can remove heat from the air.

The temperature control unit 140 sucks air from the chamber 120, transforms the state of the air to a desired state, and then discharges it into the chamber 120. As disclosed in Korean Patent Publication NO 10-2003-0029266 entitled "TEST HANDLER," the temperature control unit 140 can be implemented in such a way to supply air to respective electronic devices in the chamber through ducts.

In order to efficiently maintain the temperature inside the chamber 120, the temperature control unit 140 sucks air from the chamber 120 and supplies it back to the chamber 120, as shown by arrows in FIG. 2. This process, however, makes it impossible to maintain a constant temperature inside the chamber 120, due to the heat from the electronic devices that are tested at room temperature testing. Consequently, the electronic devices cannot be properly tested at room temperature testing. Although heat from the electronic devices may be removed by low temperature gas, it is difficult to control the supply of low temperature gas to the chamber 120 in such a way as to maintain the internal temperature of the chamber 120. Although such a controlling operation is performed, it causes another problem in that resources (gas) must be wasted.

Furthermore, as described above, the inlet and outlet shutters 150 and 160 close the inlet 121 and the outlet 122 and seal the chamber 120 in order to maintain the internal temperature environment of the chamber 120 except when the carrier board CB is carried in and out. This process, however, causes the internal temperature of the chamber 120 to increase at room temperature testing, and this makes it difficult to test electronic devices at room temperature.

SUMMARY OF THE INVENTION

The present invention is to address the above problems, and provides the following technologies.

The present invention is to provide a technology that can supply external air inside the chamber at room temperature testing and maintain the inside of the chamber at a room temperature state.

The present invention further is to provide a technology that can use air temperature-conditioned by an external air-conditioner, where the air serves as external air supplied to the inside of the chamber.

The present invention further is to provide a technology that can prevent foreign particles from entering the inside of the chamber when external air is provided.

In accordance with an exemplary embodiment of the present invention, the present invention provides a temperature control unit including a fan for supplying air to the inside a chamber, a fan driving device for driving the fan, a fan housing for containing the fan therein, the fan housing having a suction hole for sucking air from the chamber and a discharging hole for discharging the air to the chamber, and an external air inflow controlling device for allowing external air to flow in to the fan housing when the fan is driven and for blocking the external air.

Preferably, the fan housing includes an external inflow hole that the external air flows in. The external air inflow controlling device includes a shutter member for opening or closing the external air inflow opening, and a shutter member driving device for operating the shutter member.

Preferably, the external air inflow controlling device may further include a connecting member for connect the external air inflow opening to an air conditioning line, so that conditioned air flowing from the air conditioning line can be introduced to the fan housing through the external air inflow opening.

Preferably, the external air inflow controlling device may further include a blocking member to prevent external foreign particles from flowing into the external air inflow opening.

Preferably, the shutter member is automatically closed by a high or low temperature testing selection command, when high or low temperature testing is performed. The shutter member is automatically opened by a room temperature testing selection command when room temperature testing is performed.

In accordance with another exemplary embodiment of the present invention, the present invention provides a system to support the testing of electronic devices including a loading device for loading the electronic devices onto a carrier board located at a loading site, a chamber having an inlet through which the carrier board is carried in and an outlet through which the carrier board is carried out, the chamber receiving the carrier board, which is carried in through the inlet after the loading of the electronic devices by the loading device, and allowing the electronic devices, loaded on the carrier board, to be assimilated with a test temperature condition and then to be tested, an unloading device for sorting the electronic devices loaded on the carrier board, according to the grade, and unloading them from the carrier board, wherein the carrier board is located at an unloading site after being carried out from the chamber through the outlet, and a temperature control unit for supplying air to the inside the chamber to assimilate the electronic devices loaded on the carrier board located in the chamber with a test condition. Here, the temperature control unit includes a fan for supplying the air inside the chamber, a fan driving device for driving the fan, a fan housing for containing the fan therein, the fan housing having a suction hole for sucking air from the chamber and a discharging hole for discharging the air to the chamber, and an external air inflow controlling device for allowing external air to flow in to the fan housing when the fan is driven and for blocking the external air.

Preferably, the system may further include an inlet shutter for opening or closing the inlet, and an outlet shutter for opening or closing the outlet.

Preferably, when the electronic devices are tested at room temperature, the inlet and outlet shutters open the inlet and the outlet and the external air inflow controlling device of the temperature control unit allows the external air to flow into the chamber.

In accordance with another exemplary embodiment of the present invention, the present invention provides a method for controlling an internal temperature of a chamber of a system to support the testing of electronic devices. The method includes supplying low or high temperature air to the inside of the chamber when low or high temperature testing is performed, and supplying external air to the inside of the chamber when room temperature testing is performed.

Preferably, the method may further include sealing the inside of the chamber when low or high temperature testing is performed, and opening the inside of the chamber when room temperature testing is performed.

Preferably, the external air is temperature-conditioned by an external air-conditioner.

In accordance with another exemplary embodiment of the present invention, the present invention provides a method for controlling the internal temperature of a chamber of a system to support the testing of electronic devices. The method includes blocking external air from the inside of the chamber when low or high temperature testing is performed, and opening the inside of the chamber to the external air when room temperature testing is performed.

Preferably, the external air is temperature-conditioned by an external air-conditioner.

BRIEF DESCRIPTION OF THE DRAWINGS

The features and advantages of the present invention will become more apparent from the following detailed description in conjunction with the accompanying drawings, in which.

Figure 1:
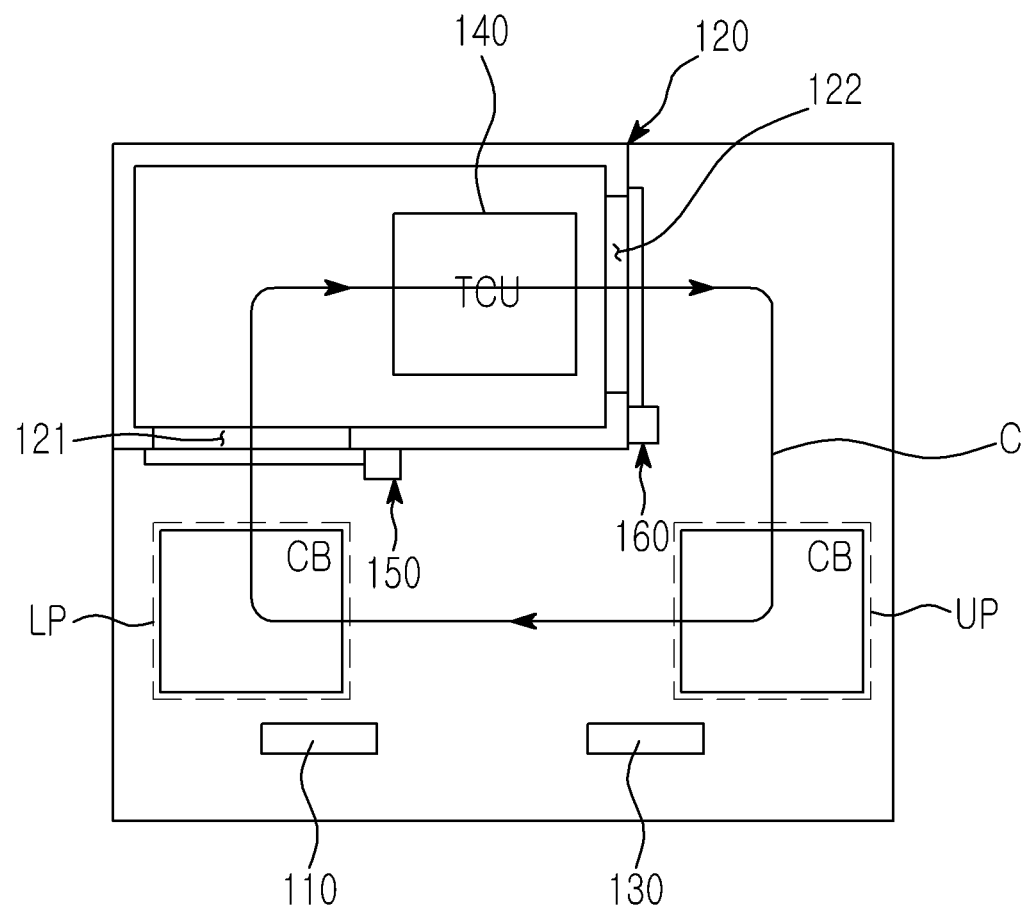
FIG. 1 is a plan view illustrating a general system to support the testing of electronic devices.
Figure 2:
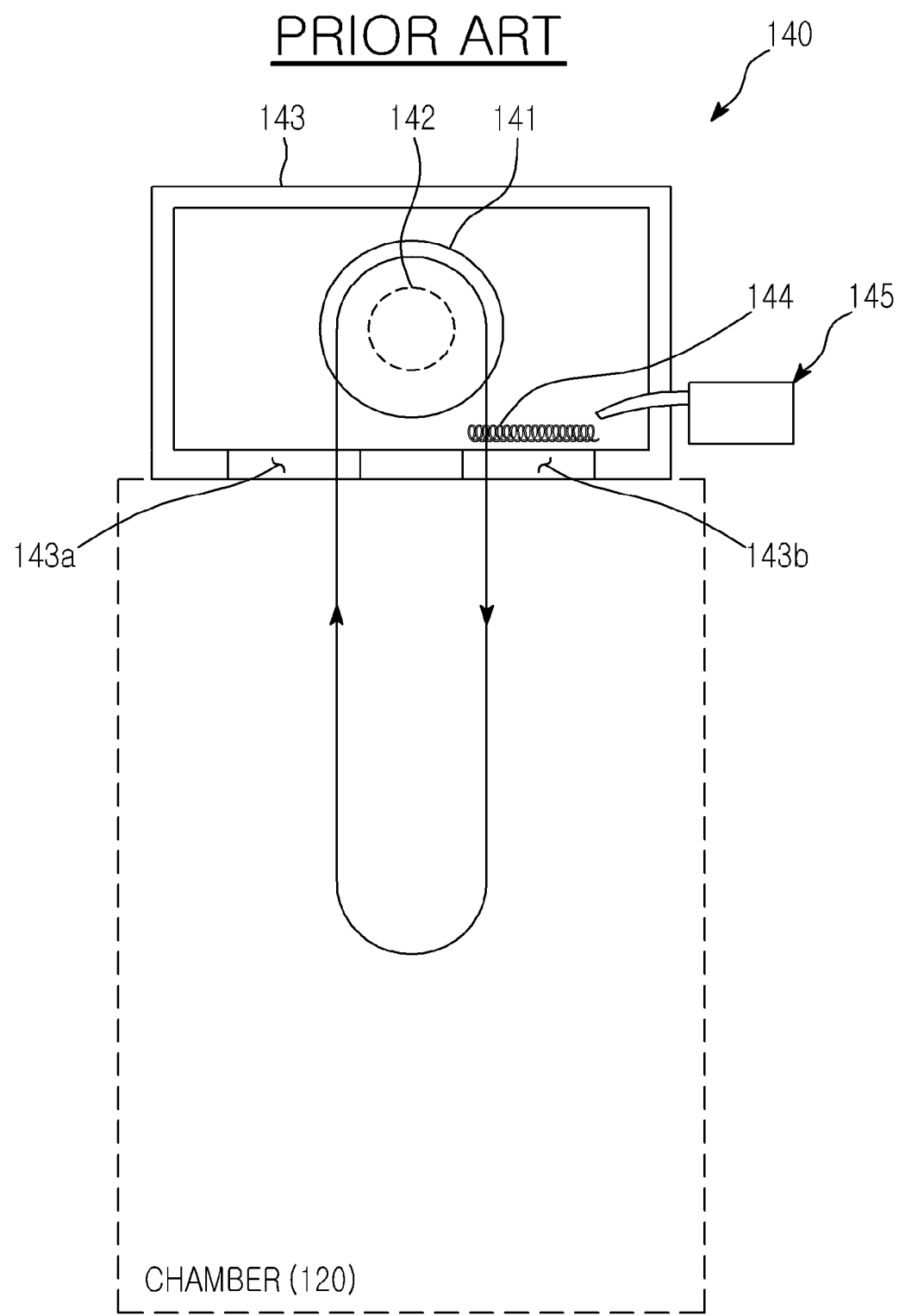
FIG. 2 is a schematic cross-sectional view illustrating a temperature control unit applied to the system shown in FIG. 1.

BRIEF DESCRIPTION OF SYMBOLS IN THE DRAWINGS 300, 700: temperature control unit
310: fan
320: fan driving device
330, 730: fan housing
340: external air inflow controlling device
341, 741: shutter member
342: shutter member driving device
750: connecting member
760: gap blocking plate

DETAILED DESCRIPTION OF EXEMPLARY EMBODIMENTS

Hereinafter, exemplary embodiments of the present invention are described in detail with reference to the accompanying drawings. The same reference numbers are used throughout the drawings to refer to the same or similar parts. Detailed descriptions of well-known functions and structures incorporated herein may be omitted to avoid obscuring the subject matter of the present invention.

Figure 3:
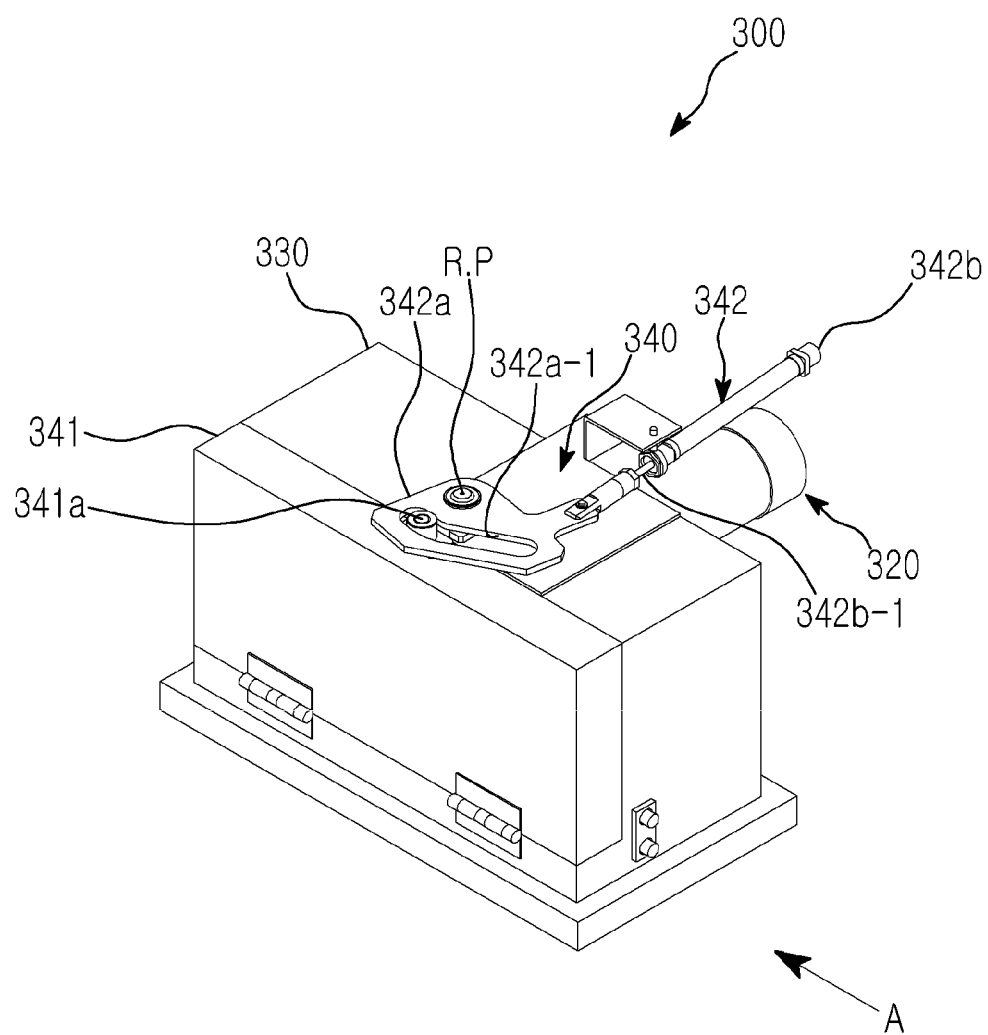
FIG. 3 is a perspective view illustrating an embodiment of a temperature control unit for a system to support the testing of electronic devices, according to the present invention.
Figure 4:
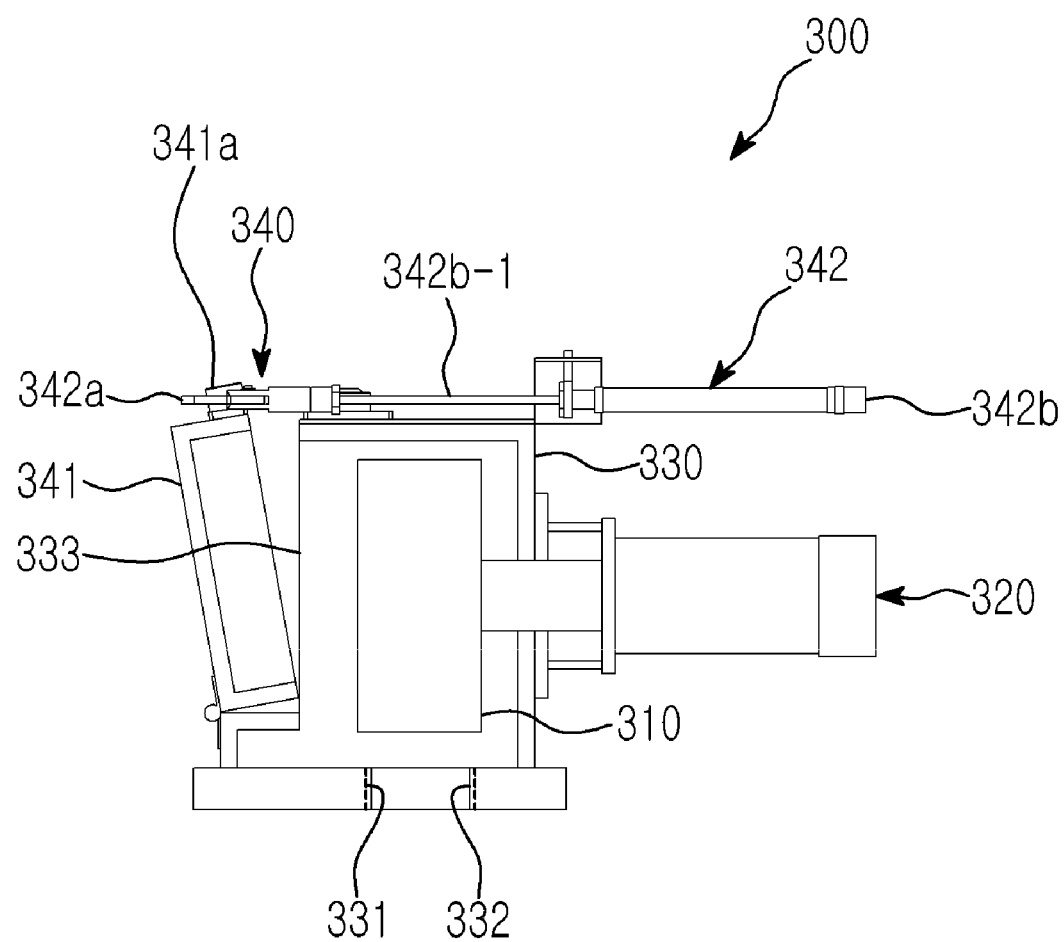
FIG. 4 is a side view illustrating the temperature control unit of FIG. 3, seen from direction A.

FIG. 3 is a perspective view illustrating an embodiment of a temperature control unit 300 for a system to support the testing of electronic devices, according to the present invention. FIG. 4 is a side view illustrating the temperature control unit 300 of FIG. 3, seen from direction A.

As shown in FIG. 3 and FIG. 4, the temperature control unit 300 includes a fan 310 (see FIG. 4), a fan driving device 320, a fan housing 330, and an external air inflow controlling device 340.

The fan 310 serves to supply air to the inside of the chamber.

The fan driving device 320 serves to rotate the fan 310. In an embodiment of the present invention, it can be implemented with a motor.

The fan housing 330 contains the fan 310 therein. It has a suction hole 331 for sucking air from the chamber and a discharging hole 332 for discharging it to the chamber. FIG. 4 shows the suction hole 331 and the discharging hole 332 by overlapping. The fan housing 330 includes an external air inflow opening 333 in its one side wall, which is open and allows external air to flow in.

The external air inflow controlling device 340 includes a shutter member 341 and a shutter member driving device 342.

The shutter member 341 serves to open or close the external air inflow opening 333. It is configured in such a way that its lower side is pivotally coupled to the fan housing 310 with a hinge and its upper end has a sliding protrusion 341a.

The shutter member driving device 342 generates a driving force so that the shutter member 341 can open or close the external air inflow opening 333 by pushing or pulling the upper end of the shutter member 341. It is configured to include a rotation link member 342a, a cylinder 342b, etc.

The rotation link member 342a, as shown in FIG. 3, is configured in such a way that its side, close to the cylinder 342b is pivotally coupled to the upper side of the fan housing 310, which becomes a rotational axis R.P, and its other side, close to the cylinder 342b, is coupled to a piston rod 342b-1, and thus the rotation link member 342a can be rotated with respect to the rotational axis R.P by the operation of the cylinder 342b. The rotation link member 342a also has a sliding hole 342a-1 at a portion opposite to the cylinder 342b, where the sliding hole 342a-1 receives the sliding protrusion 341a and allows the sliding protrusion 341a to be slidably moved. The sliding hole 342a-1 is shaped to be relatively long and parallel to a virtual line between the rotational axis R.P and the point coupled to the piston rod 342b-1. That is, the sliding hole 342a-1 is formed to have a relatively long shape along the rotational direction (or the approximate circumference direction) when the rotation link member 342 is rotated with respect to the rotational axis R.P as the cylinder 342b is operated.

It is preferable that the sliding protrusion 341a may be implemented with a bearing to minimize frictional force against the rotation link member 342a.

The cylinder 342b operates the piston rod 342b-1 back and forth in the liner direction, so that the piston rod 342b-1 can push or pull the other side of the rotation link member 342a.

In the following description, the operation of the temperature control unit 300 is explained in detail.

If the temperature control unit 300 supports the testing of electronic devices at room temperature, or performs room temperature testing, it starts to operate in a state shown in FIG. 3. When the cylinder 342b operates and thus the piston rod 342b-1 moves forward (or in the direction of increasing its length), the rotation link member 342a is rotated with respect to the rotational axis R.P, as shown in FIG. 5; the sliding protrusion 341a, received by the sliding hole 342a-1, undergoes a pushing force of the rotation link member 342a in the opposite direction of the position of the cylinder 342b, the upper end of the shutter member 341, to which the sliding protrusion 341a is installed, is also pushed and rotated with respect to the hinge, and thus the external air inflow opening 333 is opened.

Figure 6:
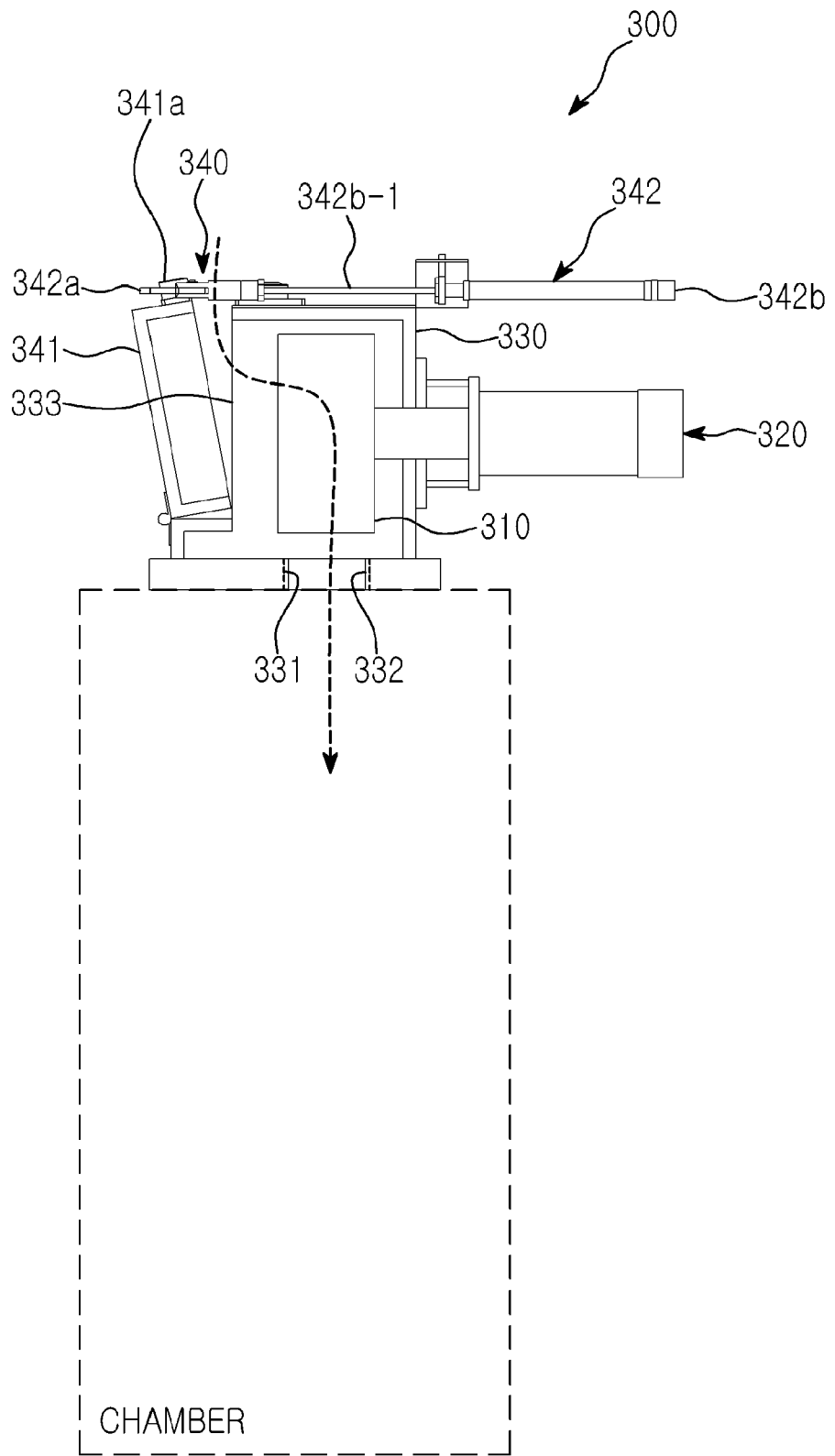

After that, as shown in FIG. 6, the fan driving device 320 operates and thus the fan 310 is rotated. External air flows into the fan housing 330 through the external air inflow opening 333 and is then flows out from the chamber through the discharging hole 332.

It is preferable to design a system to support the testing of electronic devices, to which the temperature control unit 300 according to an embodiment of the present invention 300 is applied, so that, when external air flows into the chamber, the air inside the chamber can properly flow out to the outside. For example, a system to support the testing of electronic devices is implemented in such a way that, when room temperature testing is performed, its inlet and outlet shutters are opened to allow the chamber open to external air. Although the system is implemented as described above, it should be understood that the inlet and outlet of the system should be closed to seal the chamber when low or high temperature testing is performed.

Figure 5:
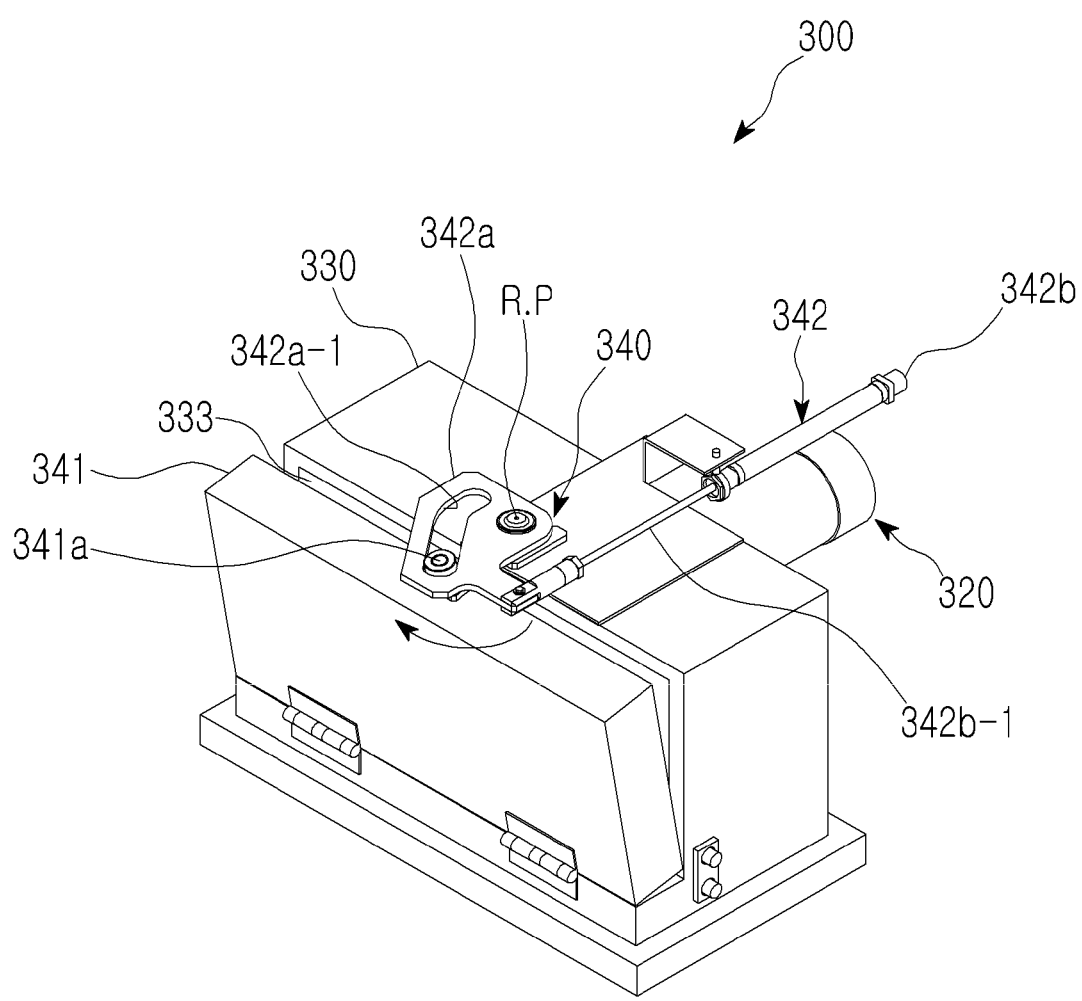
FIG. 5 and FIG. 6 are views that show an operation of the temperature control unit of FIG. 3.

On the other hand, in order to perform low or high temperature testing, the cylinder 342b is reversely operated with respect to the operation of room temperature testing, so that the system to support the testing of electronic devices returns from the state of FIG. 5 to the state of FIG. 3. Therefore, the fan housing 330 is sealed. After that, a gas supplier or a heater is operated, so that electronic devices can be tested at low or high temperature.

As described above, the system to support the testing of electronic devices, to which the temperature control unit 300 is applied, can operate in such a way that low or high temperature air is supplied to the inside of the sealed chamber in low or high temperature testing and external air is supplied to the inside of the chamber in an open state during room temperature testing. In an embodiment of the present invention, it is implemented to combine a mode where external air is supplied to the inside of the chamber with a mode where the inlet and outlets are opened to open the chamber. However, it should be understood that the system can be modified in such a way to employ only one of the modes as occasion demands.

A test house protects a variety of equipment, such as a tester, etc., installed therein. In particular, it is equipped with air conditioning lines for controlling an indoor temperature, installed on the ceiling etc. In a modification of the present invention, conditioned air, supplied from the air conditioning lines to the inside of the test house, is used to control the temperature of electronic devices to be tested.

Figure 7:
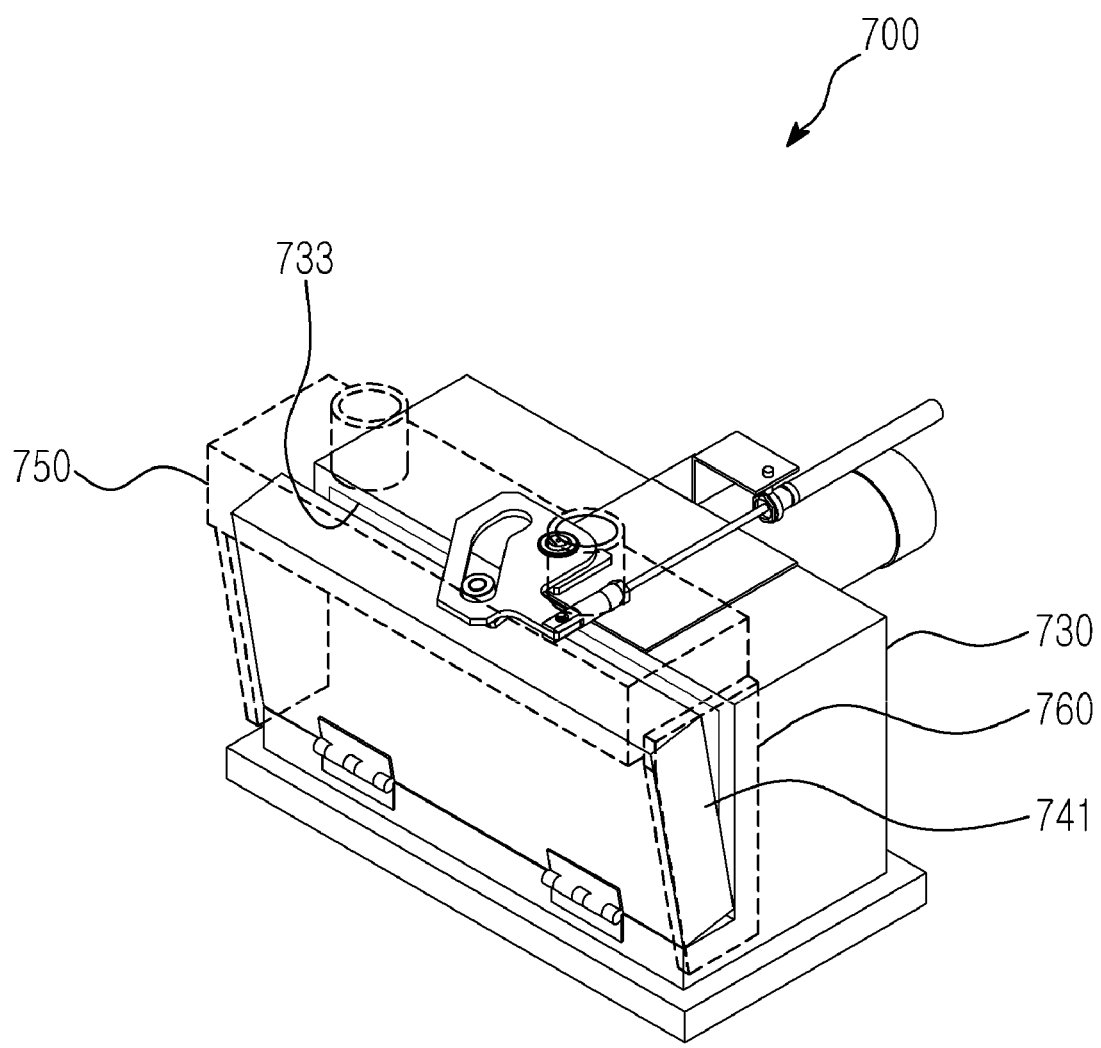
FIG. 7 and FIG. 8 are a perspective view illustrating a modification of a temperature control unit shown in FIG. 3, according to the present invention.
Figure 8:
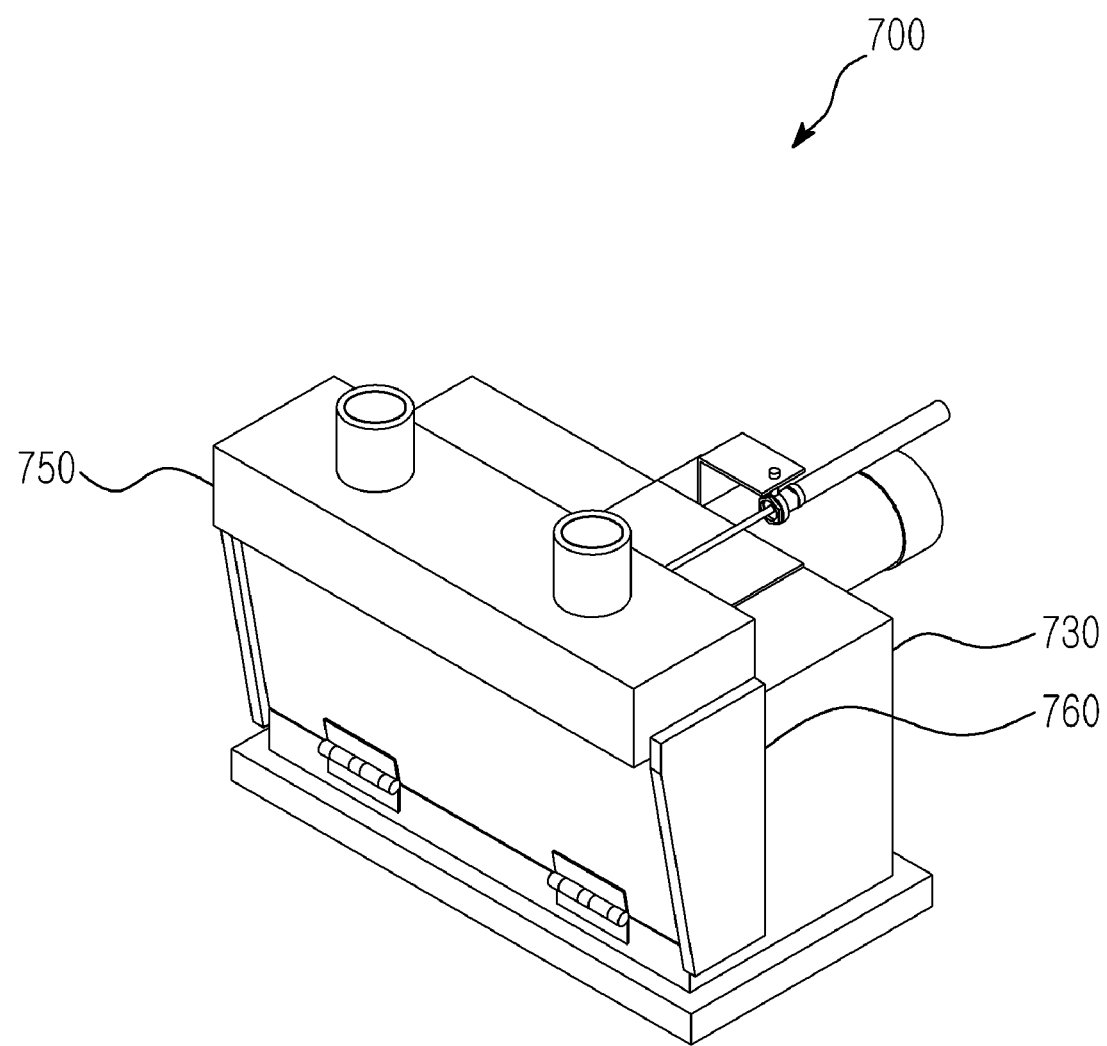

FIG. 7 and FIG. 8 are a perspective view illustrating a temperature control unit 700 modified from the temperature control unit 300 shown in FIG. 3, according to the present invention.

As shown in FIG. 7 and FIG. 8, the temperature control unit 700 is configured to be similar to the temperature control unit 300. It further includes a connecting member 750 and gap blocking plates 760 in addition to the elements of the temperature control unit 300, so its elements are labeled by reference numbers similar to the numbering system of the temperature control unit 300.

The connecting member 750 serves to connect an external air inflow opening 733 to an air conditioning line, so that conditioned air flowed from the air conditioning line can be introduced to a fan housing 730 through the external air inflow opening 733.

The gap blocking plates 760 serve to block a gap formed at the side of the temperature control unit 700 when a shutter member 741 is opened.

It should be understood that the connecting member 750 and the gap blocking plates 760 may be integrally formed as one body.

Figure 9:
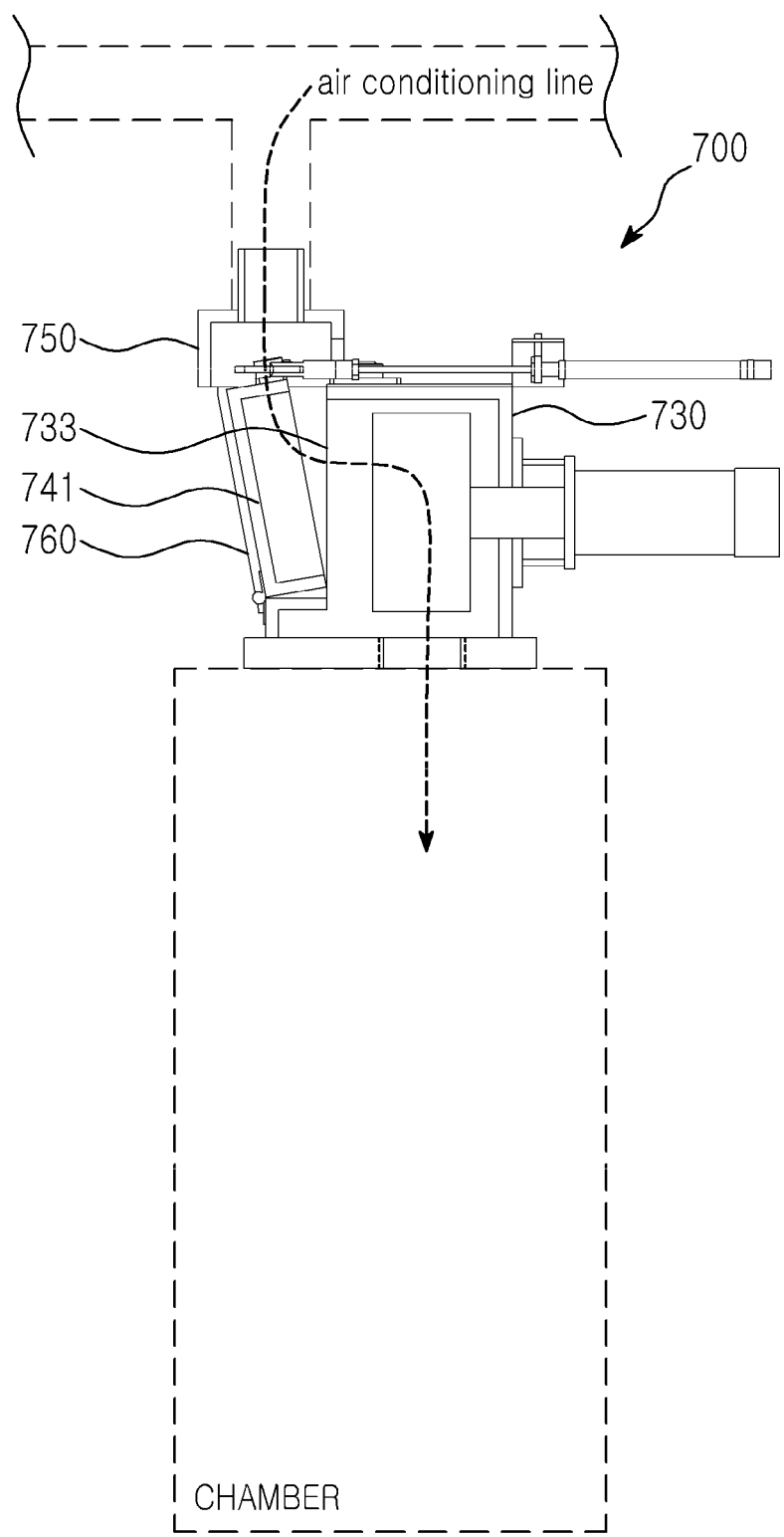
FIG. 9 is a view showing an operation of the temperature control unit of FIG. 7.

According to a modification of the present invention, the temperature control unit 700 is configured as shown in FIG. 9. The conditioned air flowing from the air conditioning line is supplied to the inside of the chamber through the connecting member 750 and the fan housing 730. That is, as the temperature control unit 700 uses not indoor air but air temperature-conditioned by the external air conditioner, the efficiency can be greatly increased. Here, the temperature-conditioned air serves as external air to be supplied to the chamber.

In general, since the tester and the system to support the testing of electronic devices are placed indoors, the indoor temperature rises due to the large amount of equipment in operation and thus the cooling efficiency of the temperature control unit is decreased. Therefore, the adequacy of the physical property to be tested cannot be secured. To resolve this problem, the temperature control unit employs the connecting member 750 that connects the external air inflow opening 733 to the air conditioning line.

The temperature control unit 300 of FIG. 3 may have a problem in that, since indoor foreign matter (dust, particle impurities, etc.) flows into the fan housing 330 via the suction force of the fan 310 and are carried in to the inside of the system to support the testing of electronic devices, they may cause the malfunction of the system or decrease the test adequacy. On the contrary, the temperature control unit 700 of FIG. 7 is configured to include the connecting member 750 that can block indoor foreign matter flowing from the external air inflow opening 733. The connecting member 750 serves to introduce air from the air conditioning line to the external air inflow opening 733 and also serves as a blocking member for blocking foreign matter.

It should be understood that the connecting member 750 can serves as only a blocking member for blocking indoor foreign matter, if conditioned air from the air conditioning line is not used. It will be easily appreciated that the blocking member may be configured to further include a filter so that it can reliably block foreign matter.

In an embodiment of the present invention, the conditioned air flowed from the air conditioning line is automatically supplied to the inside of the chamber, through the connecting member 750 and the fan housing 730, by opening or closing the shutter member 341. That is, the shutter member 341 is automatically opened when room temperature testing is performed and automatically closed for any other tests other than the room temperature testing, such as high or low temperature testing. For example, if a user selects room temperature testing, the shutter member is automatically opened according to a selection command of room temperature testing. On the contrary, if a user selects high or low temperature testing, the shutter member is automatically closed according to a selection command of high or low temperature testing. As such, automatically opening or closing the shutter member prevents low or high temperature gas from flowing out through the open space of the shutter member 341, even if low or high temperature testing is performed after the room temperature testing, so that physical properties of electronic devices can be precisely tested in the tester and the system to support the testing of electronic devices. Also, such an automatic opening or closing operation improves work efficiency, which may be lowered if a worker manually opens or closes the shutter member 341.

As described above, the present invention can supply external air to the inside of the chamber when room temperature testing is performed and maintain the chamber at room temperature, so that electronic devices can be tested at room temperature, thereby increasing the reliability of room temperature testing.

The present invention allows air temperature-conditioned by an external air conditioner to be used even in summer, if a connecting member is employed, so that the reliability of room temperature testing can be increased and indoor foreign matter is prevented from entering the system to support the testing of electronic devices.

Although exemplary embodiments of the present invention have been described in detail hereinabove, it should be understood that many variations and modifications of the basic inventive concept herein described, which may appear to those skilled in the art, will still fall within the spirit and scope of the exemplary embodiments of the present invention as defined in the appended claims.

What is claimed is:

1. A system to support testing of electronic devices, the system comprising:
a loading device for loading the electronic devices onto a carrier board located at a loading site;
a chamber having an inlet through which the carrier board is carried in and an outlet through which the carrier board is carried out, the chamber receiving the carrier board, which is carried in through the inlet after the loading of the electronic devices by the loading devices, and allowing the electronic devices, loaded on the carrier board, to be assimilated with a test temperature condition and then to be tested;
an unloading device for sorting the electronic devices loaded on the carrier board, according to a grade, and unloading them from the carrier board, wherein the carrier board is located at an unloading site after being carried out from the chamber through the outlet; and
a temperature control unit for supplying air to the chamber to equalize the electronic devices loaded on the carrier board located in the chamber with a test condition,
wherein the temperature control unit comprises:
a fan for supplying air to the inside of the chamber;
a fan driving device for driving the fan;
a fan housing for containing the fan therein, the fan housing having a suction hole for sucking air from the chamber and a discharging hole for discharging the air to the chamber; and
an external air inflow controlling device for allowing external air to flow into the fan housing when the fan is driven or for blocking the external air.

2. The system according to claim 1, wherein:
the fan housing comprises an external inflow hole through which the external air flows in; and
the external air inflow controlling device comprises:
a shutter member for opening or closing the external air inflow opening; and
a shutter member driving device for operating the shutter member.

3. The system according to claim 2, wherein the external air inflow controlling device further comprises:
a connecting member for connect the external air inflow opening to an air conditioning line, so that conditioned air flowing from the air conditioning line can be introduced to the fan housing through the external air inflow opening.

4. The system according to claim 2, wherein the external air inflow controlling device further comprises:

a blocking member to prevent external foreign matter from flowing into the external air inflow opening.

5. The system according to claim 2, wherein the shutter member is automatically closed by a high or low temperature testing selection command, when high or low temperature testing is performed, and is automatically opened by a room temperature testing selection command when room temperature testing is performed.

6. The system according to claim 1, further comprising:
an inlet shutter for opening or closing the inlet; and
an outlet shutter for opening or closing the outlet.

7. The system according to claim 1, wherein, when the electronic devices are tested at room temperature, the inlet and outlet shutters open the inlet and the outlet and the external air inflow controlling device of the temperature control unit allows the external air to flow into the chamber.

8. A method for controlling an internal temperature of a chamber of a system to support testing of electronic devices, the method comprising:
loading the electronic devices onto a carrier board located at a loading site;
carrying the carrier board into a chamber through an inlet through formed in the chamber;
after the electronic devices have been tested, carrying out the carrier board loaded with the electronic devices from the chamber through an outlet through formed in the chamber;
unloading the electronic devices from the carrier board, wherein the electronic devices are sorted according to grade;
supplying low or high temperature air to the inside of the chamber when low or high temperature testing is performed; and
supplying external air to the inside of the chamber when room temperature testing is performed.

9. The method according to claim 8, wherein the external air is temperature-conditioned by an external air-conditioner.

10. The method according to claim 8, further comprising:
sealing the inside of the chamber when low or high temperature testing is performed; and
opening the inside of the chamber when room temperature testing is performed.

11. A method for controlling an internal temperature of a chamber of a system to support testing of electronic devices, the method comprising:
loading the electronic devices onto a carrier board located at a loading site;
carrying the carrier board into a chamber through an inlet through formed in the chamber;
after the electronic devices have been tested, carrying out the carrier board loaded with the electronic devices from the chamber through an outlet through formed in the chamber;
unloading the electronic devices from carrier board, wherein the electronic devices are sorted according to grade;
blocking external air from the inside of the chamber when low or high temperature testing is performed; and
opening the inside of the chamber to the external air when room temperature testing is performed.

12. The method according to claim 11, wherein the external air is temperature-conditioned by an external air-conditioner.

* * * * *